United States Patent
Miyamoto (10) Patent No.: US 11,214,888 B2
(45) Date of Patent: Jan. 4, 2022

(54) SEAL USED FOR SUBSTRATE HOLDER

(71) Applicant: EBARA CORPORATION, Tokyo (JP)

(72) Inventor: Matsutaro Miyamoto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/677,380

(22) Filed: Nov. 7, 2019

(65) Prior Publication Data

US 2020/0190686 A1 Jun. 18, 2020

(30) Foreign Application Priority Data

Dec. 13, 2018 (JP) .............................. JP2018/233413

(51) Int. Cl.
  *C25D 17/00* (2006.01)
  *C25D 17/06* (2006.01)
(52) U.S. Cl.
  CPC ........... *C25D 17/004* (2013.01); *C25D 17/06* (2013.01)
(58) Field of Classification Search
  CPC .... C25D 17/004; C25D 17/06; C25D 17/001; H01L 21/67376; H01L 21/68728; H01L 21/68735; H01L 21/68721
  See application file for complete search history.

(56) References Cited

U.S. PATENT DOCUMENTS

| | | | |
|---|---|---|---|
| 7,067,045 B2* | 6/2006 | Keigler | C25D 17/06 204/286.1 |
| 10,087,543 B2* | 10/2018 | Zimmerman | F16J 15/00 |
| 10,407,793 B2* | 9/2019 | Fendel | C25D 17/004 |
| 2001/0037945 A1* | 11/2001 | Okase | H01L 21/67028 205/261 |
| 2006/0191786 A1* | 8/2006 | Yamamoto | C25D 17/06 204/297.06 |
| 2012/0043200 A1 | 2/2012 | Fujikata et al. | |

FOREIGN PATENT DOCUMENTS

JP   2012-062570 A   3/2012

OTHER PUBLICATIONS

Nikas GK. Analytical study of the extrusion of rectangular elastomeric seals for linear hydraulic actuators. Proceedings of the Institution of Mechanical Engineers, Part J: Journal of Engineering Tribology. 2003;217(5):365-373. (Year: 2003).*

* cited by examiner

*Primary Examiner* — Alexander W Keeling
*Assistant Examiner* — Mofoluwaso S Jebutu
(74) *Attorney, Agent, or Firm* — BakerHostetler (57) ABSTRACT

According to an embodiment, there is provided a substrate holder including: a first holding member; a second holding member; a clamper configured to clamp the first holding member and the second holding member; and a seal including a contact portion configured to contact at least one of the first holding member, the second holding member, and a substrate when the first holding member and the second holding member are clamped, in which the contact portion includes, in cross-section viewed in a plane passing a center of the substrate and perpendicular to a surface of the substrate, a first arc portion centered on a first point and a second arc portion centered on a second point different from the first point, and at least one of the first arc portion and the second arc portion has a curvature radius of 0.01 mm to 0.1 mm.

3 Claims, 9 Drawing Sheets

SEAL USED FOR SUBSTRATE HOLDER

TECHNICAL FIELD

The present application relates to a seal for use in a substrate holder. This application claims priority from Japanese Patent Application No. 2018-233413 filed on Dec. 13, 2018. The entire disclosure including the descriptions, the claims, the drawings, and the abstracts in Japanese Patent Application No. 2018-233413 filed on Mar. 29, 2019 is herein incorporated by reference.

BACKGROUND ART

Interconnections, bumps (salient electrodes), or the like have been formed on the surface of a substrate, e.g., a semiconductor wafer or a printed circuit board. As a method for forming the interconnections, the bumps, or the like, an electroplating method has been known.

A plating apparatus using the electroplating method uses a substrate holder that seals a portion near an end of a substrate having a circular shape or a polygonal shape, exposes a surface (surface to be plated) of the substrate, and holds the substrate. When the surface of the substrate is plated, the substrate holder holding the substrate is immersed in a plating solution. Because the end face of the substrate is sealed by the substrate holder, although the surface of the substrate is exposed to the plating solution, a power feed portion for the substrate positioned on an outer side of the seal will not contact the plating solution.

CITATION LIST

Patent Literature

PTL 1: JP 2012-062570 A

SUMMARY OF INVENTION

Technical Problem

In order to prevent the power feed portion of the substrate holder from contacting the plating solution in a state where the substrate holder holding the substrate is immersed in the plating solution, the end face of the substrate needs to be sealed properly. In a state where the substrate is held by the substrate holder, a seal member is arranged in a compressed state in the vicinity of an end of the substrate. It is important that the seal member gives a sufficient pressing force to the substrate with the seal member being compressed.

Solution to Problem

According to an embodiment, there is provided a substrate holder including: a front frame; a rear frame; a clamper for clamping the front frame and the rear frame; and a seal including a contact portion that contacts one of the front frame and the rear frame and a substrate when the front frame and the rear frame are clamped, in which the contact portion includes, in cross-section viewed in a plane perpendicular to a longitudinal direction of the seal, a first arc portion centered on a first point and a second arc portion centered on a second point different from the first point, and at least one of the first arc portion and the second arc portion has a curvature radius of 0.01 mm to 0.1 mm.

DESCRIPTION OF EMBODIMENTS

Embodiments of a substrate conveying apparatus and a substrate processing apparatus including the substrate conveying apparatus according to the present invention are described below in conjunction with the accompanying drawings. In the accompanying drawings, the same or similar elements are designated by the same or similar reference numerals, and a redundant description regarding the same or similar elements in the embodiments may be omitted. Moreover, features indicated in each of the embodiments can also be applied to the other embodiments as long as they do not contradict each other.

<Regarding Overview of Plating Apparatus>

Figure 1:
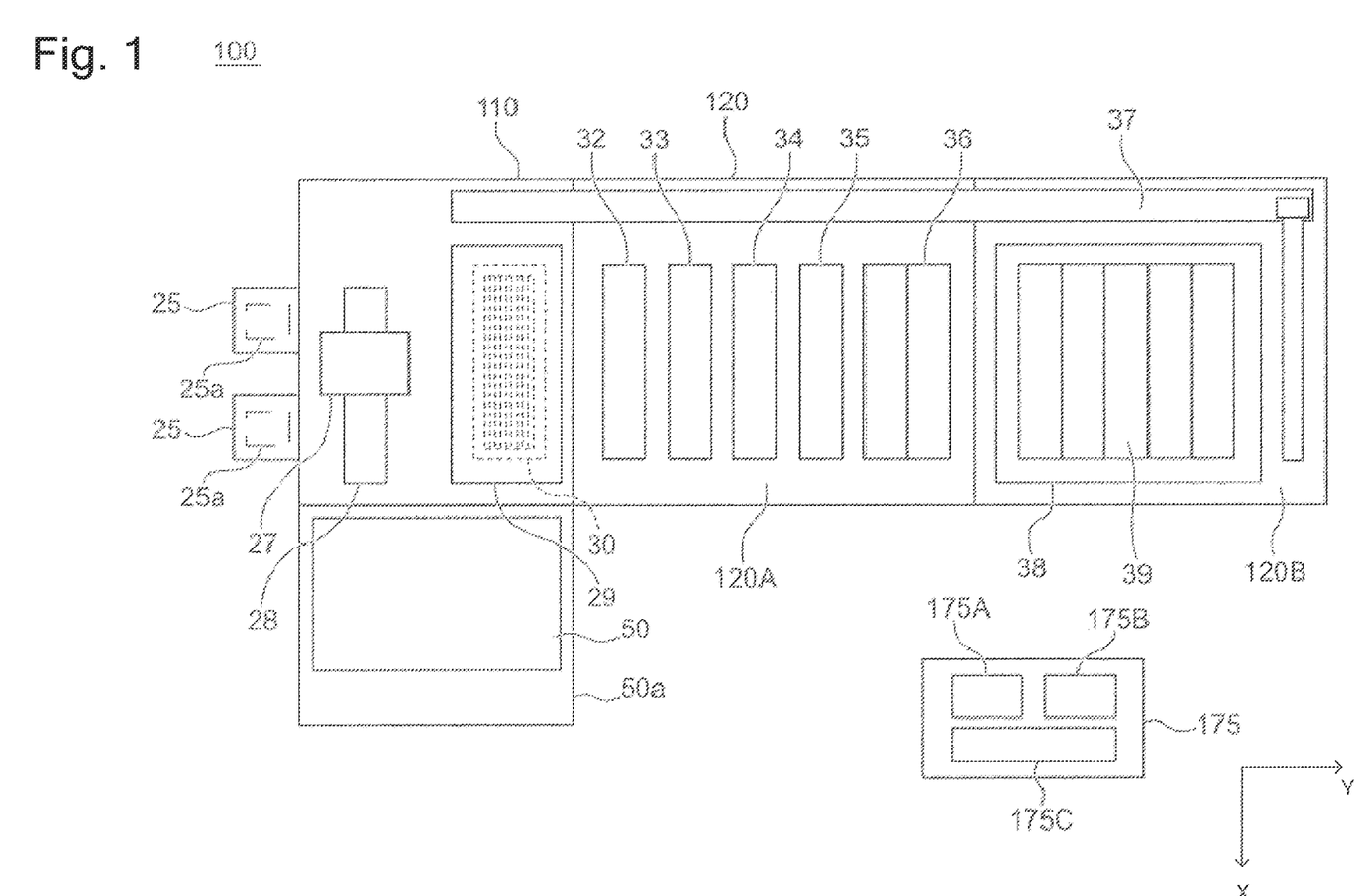
FIG. 1 is a general arrangement view of a plating apparatus according to an embodiment.

FIG. 1 is a general arrangement view of a plating apparatus for which a substrate holder according to an embodiment is used. As illustrated in FIG. 1, a plating apparatus 100 is roughly divided into a loading/unloading portion 110 that loads a substrate to a substrate holder 1 (for reference numeral "1," see FIG. 2 onwards) or unloads a substrate from the substrate holder 1, a processing portion 120 that processes a substrate, and a cleaning portion 50a. The processing portion 120 includes a pre-processing/post-processing portion 120A that further performs pre-processing and post-processing on the substrate, and a plating processing portion 120B that performs plating processing on the substrate. Note that the substrate processed by the plating apparatus 100 includes a polygonal substrate and a circular substrate. Moreover, the polygonal substrate includes a glass substrate, a liquid crystal substrate, a printed circuit board having a polygonal shape, e.g., a rectangular shape, and other polygonal objects to be plated. The circular substrate includes a semiconductor wafer, a glass substrate, and other circular objects to be plated.

The loading/unloading portion 110 includes two cassette tables 25 and a substrate attachment/detachment mechanism 29. Each cassette table 25 includes a cassette 25a that stores a substrate, e.g., a semiconductor wafer, a glass substrate, a liquid crystal substrate, or a printed circuit board. The substrate attachment/detachment mechanism 29 is configured to attach or detach the substrate to/from the substrate holder 1. Moreover, in the vicinity of (e.g., below) the substrate attachment/detachment mechanism 29, a stocker 30 for accommodating the substrate holder 1 is provided. In the middle of these units 25, 29 and 30, a substrate conveying apparatus 27 including a conveyance robot that conveys the substrate between the units is arranged. The substrate conveying apparatus 27 is configured to be capable of movement by a movement mechanism 28.

The cleaning portion 50a includes a cleaning apparatus 50 that cleans and dries a plated substrate. The substrate conveying apparatus 27 is configured to convey the plated substrate to the cleaning apparatus 50 and ejects the cleaned substrate from the cleaning apparatus 50.

The pre-processing/post-processing portion 120A includes a prewet bath 32, a presoak bath 33, a prerinse bath 34, a blow bath 35, and a rinse bath 36. In the prewet bath 32, the substrate is immersed in deionized water. In the presoak bath 33, an oxide film on the surface of a conductive layer, e.g., a seed layer, formed on the surface of the substrate is removed by etching. In the prerinse bath 34, the presoaked substrate is cleaned by cleaning liquid (deionized water or the like) together with the substrate holder. In the blow bath 35, the cleaned substrate is drained. In the rinse bath 36, the plated substrate is cleaned by cleaning liquid together with the substrate holder. The prewet bath 32, the presoak bath 33, the prerinse bath 34, the blow bath 35, and the rinse bath 36 are arranged in this order. Note that the configuration of the pre-processing/post-processing portion 120A of the plating apparatus 100 is an example. The configuration of the pre-processing/post-processing portion 120A of the plating apparatus 100 is not limited, but other configurations can be adopted.

The plating processing portion 120B includes a plurality of plating baths 39 including an overflow bath 38. Each plating bath 39 stores one substrate therein and immerses the substrate in a plating solution held therein to perform plating, e.g., copper plating, on the surface of the substrate. Here, the type of plating solution is not particularly limited, but various plating solutions may be used depending on intended purpose.

The plating apparatus 100 includes a substrate holder conveying apparatus 37 that is positioned at a side of these devices and adopts, e.g., a linear motor system, that conveys the substrate holder together with the substrate between these devices. The substrate holder conveying apparatus 37 is configured to convey the substrate holder between the substrate attachment/detachment mechanism 29, the prewet bath 32, the presoak bath 33, the prerinse bath 34, the blow bath 35, the rinse bath 36, and the plating bath 39.

A plating processing system including a plurality of plating apparatuses 100 configured in the aforementioned manner includes a controller 175 that is configured to control the aforementioned portions. The controller 175 includes a memory 175B that stores a predetermined program, a CPU (Central Processing Unit) 175A that executes a program of the memory 175B, and a control portion 175C that is achieved when the CPU 175A executes a program. The control portion 175C can control, for example, conveyance by the substrate conveying apparatus 27, attachment/detachment of the substrate to/from the substrate holder by the substrate attachment/detachment mechanism 29, conveyance by the substrate holder conveying apparatus 37, plating current and plating time in each plating bath 39, and an opening size of an anode mask (not illustrated) and an opening size of a regulation plate (not illustrated), which are arranged at each plating bath 39. Moreover, the controller 175 is configured to be capable of communication with a high-order controller, which is not illustrated, that integrally controls the plating apparatus 100 and other associated apparatuses, and can exchange data with database of the high-order controller. Here, a storage medium constituting the memory 175B stores various setting data and various programs, e.g., a plating processing program, which will be described later. As the storage medium, a publicly known storage medium can be used including a computer-readable memory, e.g., a ROM or a RAM, and a disk-shaped storage medium, e.g., a hard disk, a CD-ROM, a DVD-ROM, or a flexible disk.

<Regarding the Substrate Holder 1>

Figure 2A:
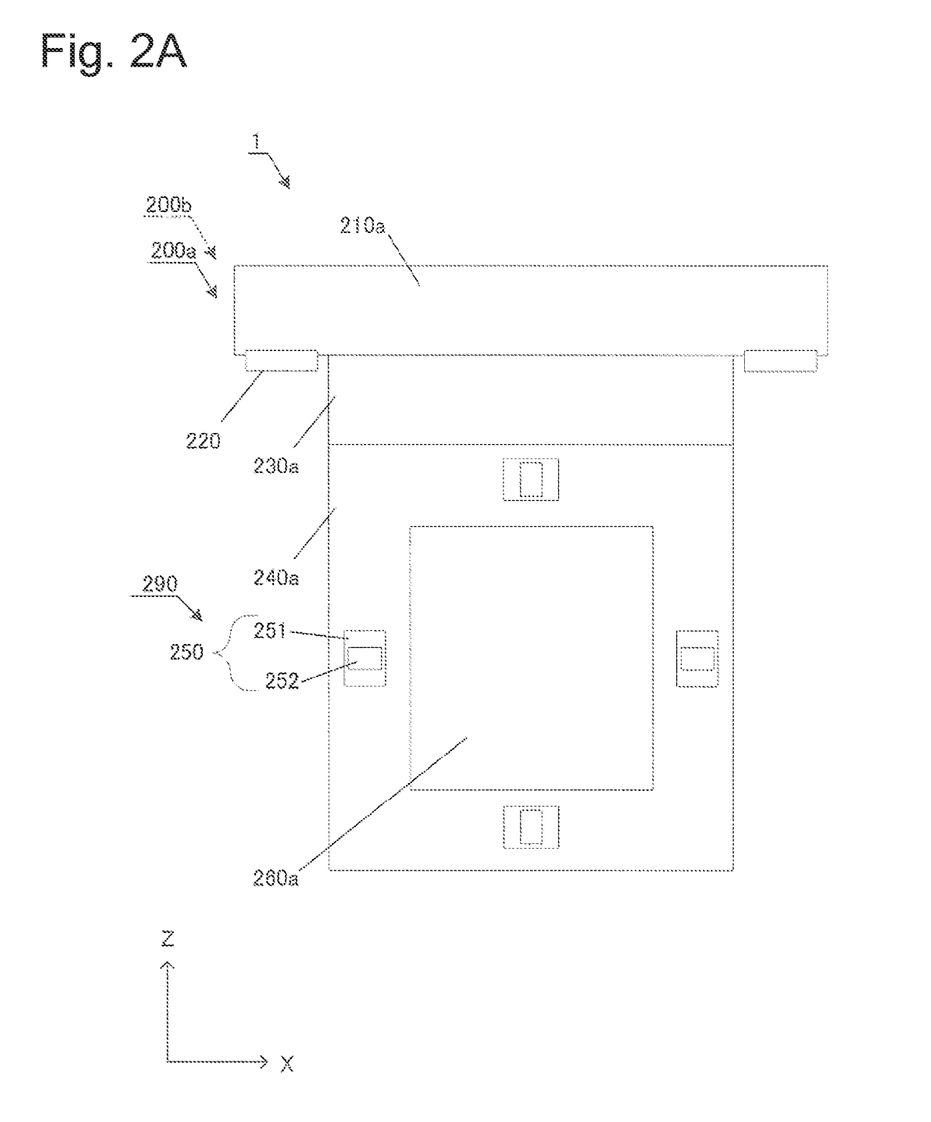
FIG. 2A is a front view schematically illustrating a substrate holder according to an embodiment.
Figure 2B:
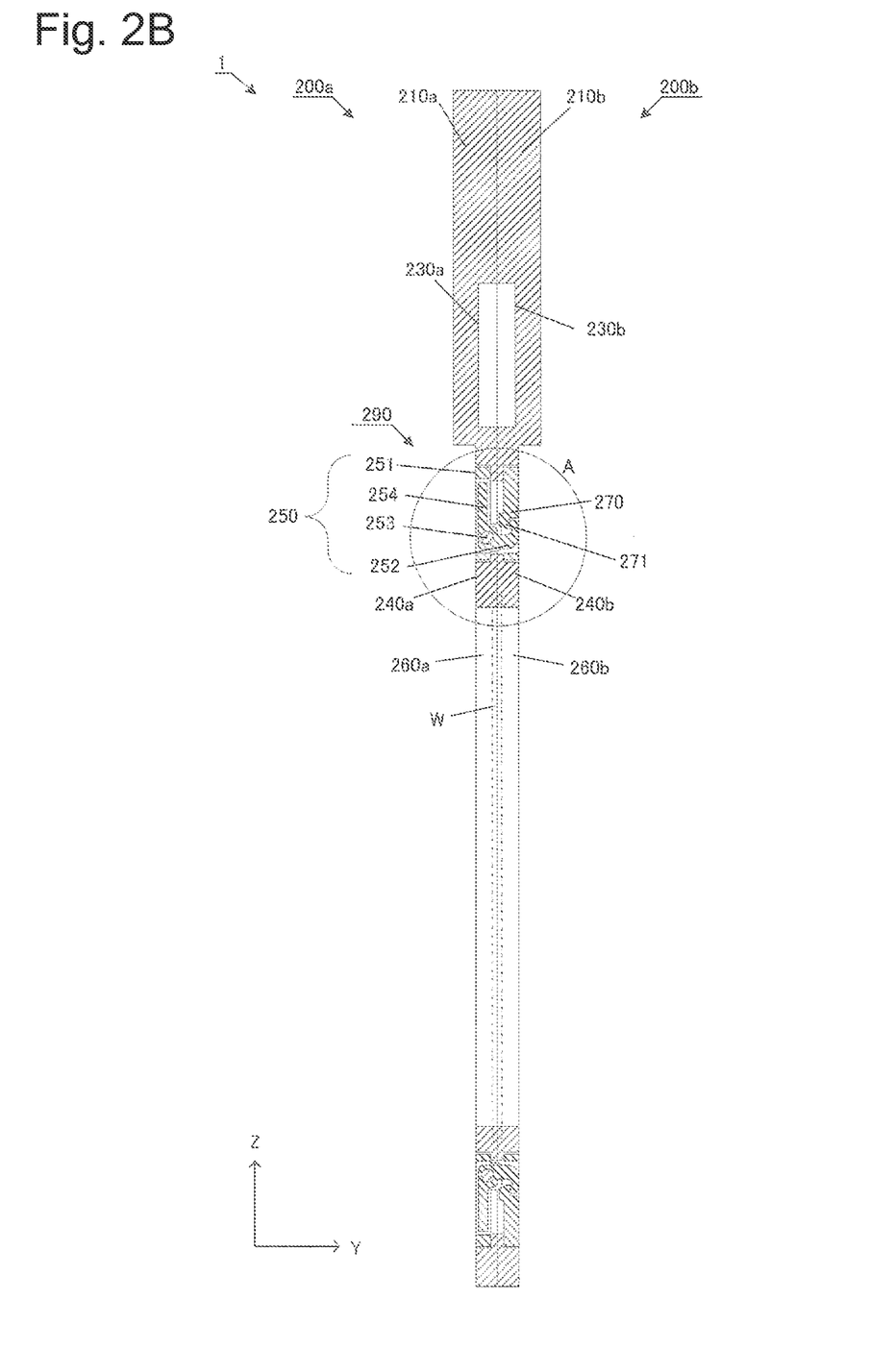
FIG. 2B is a cross-sectional side view schematically illustrating a substrate holder according to an embodiment.
Figure 2C:
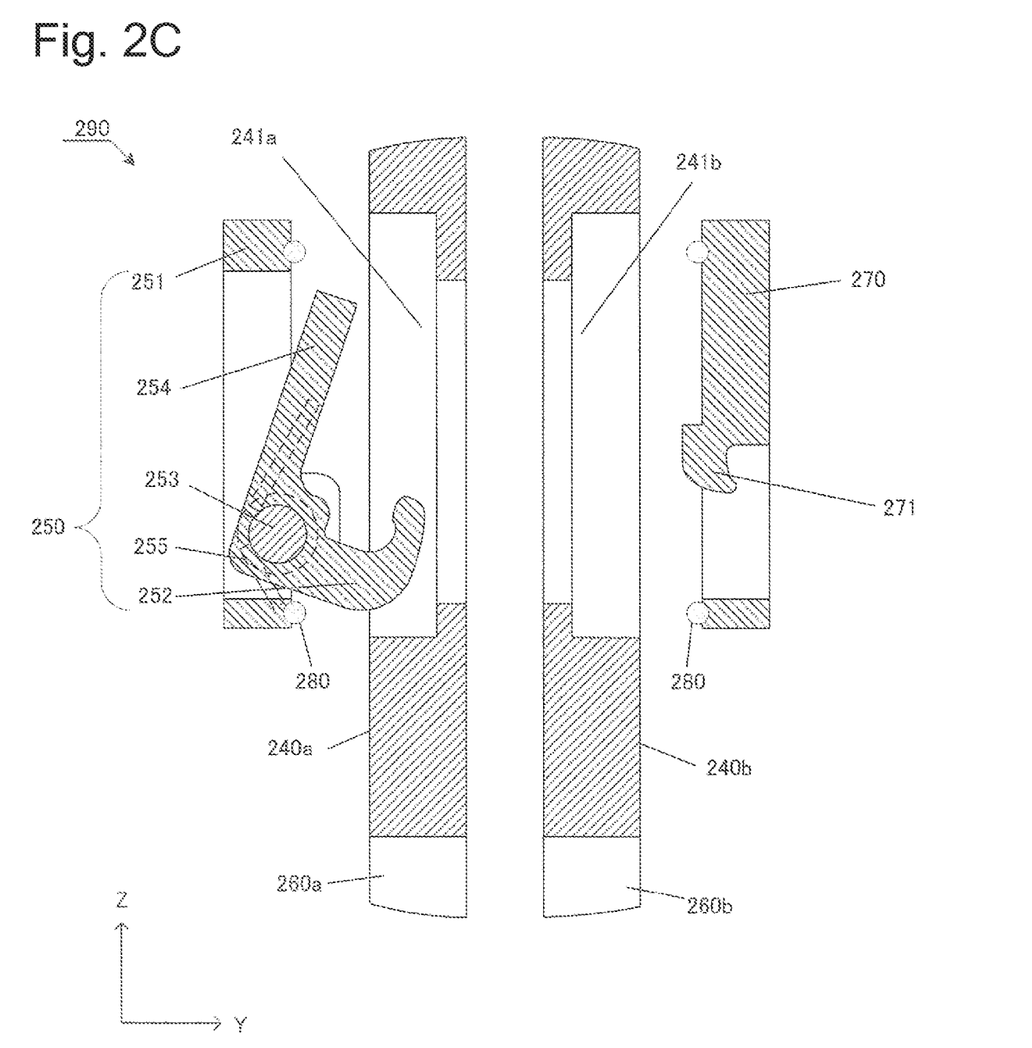
FIG. 2C is an enlarged view of a portion indicated at "A" in FIG. 2B.

Next, the substrate holder 1 according to an embodiment is described in conjunction with FIG. 2. FIG. 2A is a front view schematically illustrating the substrate holder 1 according to an embodiment. FIG. 2B is a cross-sectional side view schematically illustrating the substrate holder 1 according to an embodiment. FIG. 2C is an enlarged view of a portion indicated at "A" in FIG. 2B. Note that FIG. 2C is an exploded view. In the description below, a right-and-left direction (longitudinal direction of an arm portion 210a, which will be described later) of FIG. 2A is X direction, a direction perpendicular to the plane of the drawing (direction perpendicular to the surface of a substrate W to be held) is Y direction, and an up-and-down direction is Z direction. Regarding the X direction, a rightward direction in FIG. 2A is positive direction. Regarding the Y direction, a depth direction with respect to the plane of the drawing of FIG. 2A is positive direction. Regarding the Z direction, an upward direction in FIG. 2A is positive direction.

The substrate holder 1 is a member for sandwiching the substrate between frames to hold the substrate. The substrate holder 1 includes a front frame 200a (holding member) and a rear frame 200b (holding member). More specifically, at least a part of the substrate holder 1 is formed of a combination of the front frame 200a and the rear frame 200b. The front frame 200a and the rear frame 200b are clamped by at least one, preferably a plurality of dampers 290 (clamper 290 will be described later). The dotted line extending from reference numeral "200b" of FIG. 2A indicates that FIG. 2A does not illustrate the rear frame 200b. The substrate holder 1 is configured to hold the substrate W in a sandwiching manner between the front frame 200a and the rear frame 200b. The substrate W is indicated by the imaginary line in FIG. 2B.

The front frame 200a and the rear frame 200b have a symmetric structure except for a hook portion 250 and a plate 270, which will be described later. Accordingly, the names "front" and "rear" are merely for the sake of convenience. In other words, either the side where the front frame 200a is positioned or the side where the rear frame 200b is positioned may be treated as a front side. However, the front frame 200a and the rear frame 200b do not need to be designed to have a symmetric structure.

The arm portion 210a is provided in an upper part of the front frame 200a. A shoulder electrode 220 may be provided at a shoulder portion of the arm portion 210a. In the example of FIG. 2, two shoulder electrodes 220 are provided at both shoulders of the arm portion 210a. Note that, in FIG. 2A, only one shoulder electrode 220 is representatively designated by the reference numeral. The shoulder electrodes 220 are electrically connected to a substrate electrode, which will be described later, by a conductive path (e.g., a wire or a busbar), which is not illustrated. The substrate electrode, which will be described later, is electrically connected to the substrate W, and therefore the shoulder electrode 220 is electrically connected to the substrate W. The plating apparatus 100 feeds current required for the plating process to the substrate W via the shoulder electrode 220. The rear frame 200b includes an arm portion 210b. The configuration of the arm portion 210b is equivalent to that of the arm portion 210a.

The front frame 200a includes a wire storage portion 230a. The wire storage portion 230a is provided between the arm portion 210a and a frame body 240a, which will be described later. The wire storage portion 230a is configured to have a space for accommodating a wire that electrically connects the shoulder electrode 220 and the substrate W. When the shoulder electrode 220 and the substrate W are electrically connected by a busbar, the front frame 200a may not include the wire storage portion 230a. The rear frame 200b includes a wire storage portion 230b. The configuration of the wire storage portion 230b is equivalent to that of the wire storage portion 230a.

The front frame 200a further includes the frame body 240a. The rear frame 200b further includes a frame body 240b. The frame body 240a and the frame body 240b are members having a roughly plate shape. In the central portions of the frame body 240a and the frame body 240b, opening 260a and opening 260b for exposing the substrate W to be held are formed. The shape of the opening 260a and the opening 260b preferably corresponds to the shape of a region to be plated of the substrate W. For example, when the substrate W has a polygonal shape, a region to be plated also typically has a polygonal shape. Accordingly, in the example of FIG. 2, the opening 260a and the opening 260b have a polygonal shape. The substrate W is sandwiched between the frame body 240a and the frame body 240b such that the frame body 240a and the frame body 240b hold the substrate W in cooperation. A portion of holding the substrate W will be described later in conjunction with FIG. 3.

One surface of the substrate W being held is exposed to the outside through the opening 260a formed through the frame body 240a. The other surface of the substrate W being held is exposed to the outside through the opening 260b formed through the frame body 240b. Accordingly, when the substrate holder 1 is immersed in the plating solution, both surfaces of the substrate W contact the plating solution. In other words, the use of the substrate holder 1 of FIG. 2 enables plating of both surfaces of the substrate W. Note that, when electric conditions or the like in the substrate holder 1 are adjusted, the substrate holder 1 of FIG. 2 may be used for plating one surface. Moreover, the substrate holder 1 may be configured to include only one of the opening 260a and the opening 260b (in this case, the substrate holder 1 is a holder for one-side plating). That is, the front frame 200a and the rear frame 200b may not necessarily include the openings 260a and 260b, respectively.

In order to clamp the front frame 200a and the rear frame 200b, the substrate holder 1 includes one or more dampers 290. Each damper 290 includes a hook portion 250 attached to the front frame 200a, more specifically the frame body 240a, and a plate 270 attached to the rear frame 200b, more specifically the frame body 240b. In the example of FIG. 2, the damper 290 is provided near the opening 260a. More specifically, in the example of FIG. 2, the damper 290 is provided near the middle of each side of the opening 260 having a polygonal shape. Accordingly, in the example of FIG. 2, a total of four clampers 290 is provided. Note that, in FIGS. 2A and 2B, only one damper 290 is representatively designated by the reference numeral.

The hook portion 250 includes a hook base 251 attached to the frame body 240a, a hook body 252, and a shaft 253 supporting the hook body 252 to be pivotable with respect to the hook base 251. The hook portion 250 may further include a lever 254 for pivotally moving the hook body 252 about the shaft 253. The hook body 252 extends to the back surface side of the substrate holder 1, i.e., in the direction of the rear frame 200b. The shaft 253 extends in a plane parallel to the surface of the substrate to be held. The specific direction of the longitudinal direction of the shaft 253 in a plane parallel to the surface of the substrate to be held may vary with the damper 290. At least one of the hook base 251, the hook body 252, the shaft 253, and the lever 254 may be formed of titanium or titanium alloy.

The hook portion 250 may further include a press member 255 that applies a force in a direction in which hooking by the hook body 252 to a claw 271, which will be described later, is maintained (counterclockwise direction in the case of the hook portion 250 of FIG. 2C). When the press member 255 applies a force to the hook body 252 to maintain hooking by the hook body 252, it is possible to prevent the hook body 252 from being unhooked from the claw 271. The press member 255 may be, for example, a spring, and may more specifically be a torsion spring. The torsion spring makes a contribution to space saving of the press member 255 and the other components. Accordingly, adoption of the torsion spring as the press member 255 can make a contribution to thinning the holder thickness. Note that a reason why thinning of the holder thickness is preferable will be described later. The press member 255 may be those other than a spring, e.g., a member that is operated by an electromagnetic means.

The frame body 240a includes a port 241a (see FIG. 2C). The port 241a is provided for attachment of the hook body 252. The port 241a is configured such that at least the hook body 252 can access at least a part of the plate 270, which will be described later, more specifically the hook body 252 can access the claw 271 of the plate 270. The hook portion 250 is attached to the port 241a by a fixation member, e.g., a bolt. In order to thin the holder thickness as far as possible, the substrate holder 1 (particularly, the hook portion 250 and the port 241a of substrate holder 1) is preferably configured such that the hook portion 250 does not protrude from the frame body 240a, i.e., the hook portion 250 is embedded in the frame body 240a. Moreover, with the hook portion 250 not protruding from the frame body 240a, it is possible to reduce the amount of plating solution remaining in the substrate holder 1 when the substrate holder 1 is removed from the plating solution. Moreover, with the hook portion 250 not protruding from the frame body 240a, it is possible to prevent interference between the hook portion 250 and the composition of the plating bath etc.

The frame body 240b includes a port 241b (see FIG. 2C). The position and the number of ports 241b are correspond to the position and the number of ports 241a. The plate 270 is attached to the port 241b by a fixation member, e.g., a bolt. The plate 270 includes the claw 271 configured to be hooked by the hook body 252 by pivotal movement of the hook body 252. The claw 271 extends in the direction of the front frame 200a. When the hook body 252 is hooked on the claw 271, the frame body 240a is fixed to the frame body 240b. When the substrate W is appropriately arranged between the frame body 240a and the frame body 240b, the substrate W will be held by the substrate holder 1 when the hook body 252 is hooked on the claw 271. In order to thin the holder thickness as far as possible, the plate 270 and the port 241b are preferably configured such that the plate 270 does not protrude from the frame body 240b, i.e., the plate 270 is embedded in the frame body 240b. Moreover, with the plate 270 not protruding from the frame body 240b, it is possible to reduce the amount of plating solution remaining in the substrate holder 1 when the substrate holder 1 is removed from the plating solution. Moreover, with the plate 270 not protruding from the frame body 240b, it is possible to prevent interference between the plate 270 and the composition of the plating bath etc. The hook body 252 extending toward the rear frame 200b is also preferably configured not to protrude from the frame body 240b.

As described above, in a preferable embodiment, both the hook portion 250 and the plate 270 are configured not to protrude from the respective frames, i.e., embedded in the respective frames. In the present specification, this is expressed as "the clamper 290 is embedded in the front frame 200a and the rear frame 200b."

An elastic support member 280 may be provided between the hook base 251 and the frame body 240a. The elastic support member 280 is a member for elastically supporting a member, and can be also referred to as a "floating member." Attention is drawn to the fact that "floating" herein is not "electrical floating" (but not excluding that electrical floating is achieved by the elastic support member 280). In the example of FIG. 2, the elastic support member 280 is an O-ring. Note that, in FIG. 2, a groove for attaching the O-ring is not illustrated. In addition to the O-ring, an elastic body, e.g., a spring, can be used as the elastic support member 280. The elastic support member 280 may also be provided between the plate 270 and the frame body 240b.

It is desirable that at least the thickness of a portion of the substrate holder for plating the substrate W that is immersed in the plating solution be thin as far as possible. There are two major reasons described below. First, a large thickness of the holder results in a large width of the plating bath, thereby increasing the size of the apparatus. In particular, when the substrate holder 1 is a holder for two-side plating, an influence on an increase in size of the apparatus is significant. Secondly, a large thickness of the holder is likely to result in insufficient stirring of the plating solution near the substrate W. Moreover, it is preferable that a portion of the substrate holder 1 that is immersed in the plating solution do not include a protrusion portion. This is because the protrusion portion can define the thickness of the substrate holder 1.

With the configuration of FIG. 2, the hook body 252 extends toward the front frame 200a or the rear frame 200b to which the hook portion 250 is not attached. Then, with the configuration of FIG. 2, the claw 271 extends toward the front frame 200a or the rear frame 200b to which the plate 270 is not attached. Therefore, the configuration of FIG. 2 can eliminate or at least reduce the length of the hook body 252, the claw 271 and the like protruding from the front frame 200a and the rear frame 200b. In other words, when the substrate holder 1 is configured as illustrated in FIG. 2, it is possible to thin the thickness of a portion (frame body 240a, hook portion 250, frame body 240b, and plate 270) to be immersed in the plating solution. Moreover, there is an advantage that the hook portion 250 and the plate 270 of FIG. 2 do not protrude from the frame body 240a and the frame body 240b.

In the embodiment illustrated in FIG. 2, the lever 254 is pressed in the direction of the frame body 240b, i.e., in the direction of the back side, and the hook body 252 is unhooked from the claw 271. Instead, the lever 254 and the like may be configured such that the lever 254 is pulled to the front side and the hook body 252 is unhooked from the claw 271. However, the configuration and control for pulling the lever 254 can be complicated as compared with the structure and control for pressing the lever 254. Accordingly, as illustrated in FIG. 2, the lever 254 and the like are preferably configured such that the lever 254 is pressed in the direction of the back side and the hook body 252 is unhooked from the claw 271.

In the embodiment illustrated in FIG. 2, the hook portion 250 is attached to the front frame 200a, and the plate 270 is attached to the rear frame 200b. Alternatively, the hook portion 250 may be attached to the rear frame 200b, and the plate 270 may be attached to the front frame 200a. In other words, a certain hook portion 250 is attached to one of the front frame 200a and the rear frame 200b, and a plate 270 corresponding to the hook portion 250 is attached to the other of the front frame 200a and the rear frame 200b. Furthermore, in the case of the substrate holder 1 including a plurality of dampers 290, the hook portion 250 may be provided in both the front frame 200a and the rear frame 200b. In this case, the plate 270 is also provided in both the front frame 200a and the rear frame 200b to correspond to the arrangement of the hook portion 250. From a viewpoint of simplicity for pivotal movement of the hook body 252, it is preferable that one of the hook portion 250 and the plate 270 be provided in the front frame 200a and the other be provided in the rear frame 200b.

<Regarding Details of a Portion Holding the Substrate W>

Figure 3:
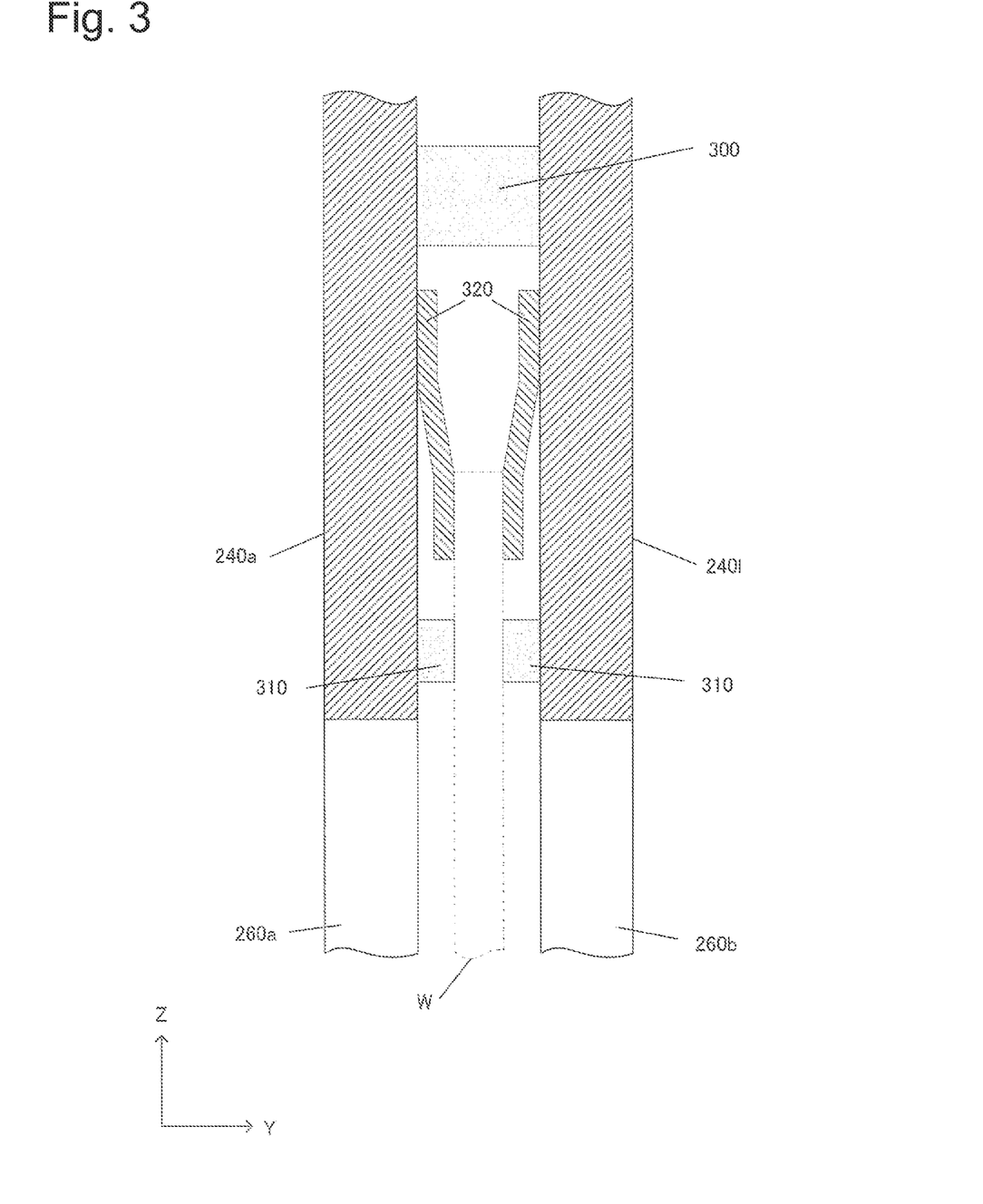
FIG. 3 is a cross-sectional side view of a portion of a substrate holder that holds a substrate.

Next, details of a portion of the substrate holder 1 that holds the substrate W are described in conjunction with FIG. 3. FIG. 3 is a cross-sectional side view of a portion of the substrate holder 1 that holds the substrate W. The substrate holder 1 is a holder for plating both surfaces of the substrate W, and therefore the substrate holder 1 needs to feed current to both surfaces of the substrate W. Thus, the frame body 240a and the frame body 240b of FIG. 3 include substrate electrodes 320. The substrate electrode 320 provided on the frame body 240a is electrically connected to a surface (surface facing the front side) of the substrate W, and the substrate electrode 320 provided on the frame body 240b is electrically connected to the back surface of the substrate W. However, a configuration other than the configuration illustrated in FIG. 3 may be adopted. Examples of a different configuration include a configuration in which the substrate electrode 320 is provided on only one of the frame body 240a and the frame body 240b, and the substrate electrode 320 is in contact with both surfaces of the substrate W. The substrate electrode 320 is electrically connected to the shoulder electrode 220 by a means, e.g., a wire or a busbar, which is not illustrated. Accordingly, the current fed to the shoulder electrode 220 is fed to the substrate W via the substrate electrode 320. In this case, the corresponding relationship between the shoulder electrode 220 and the substrate electrode 320 may be configured such that the right and left shoulder electrodes 220 of FIG. 2A independently feed current to the front surface and the back surface of the substrate so that, for example, the left shoulder electrode 220 feeds current to the substrate electrode 320 of the frame body 240a corresponding to the front surface of the substrate W and the right shoulder electrode 220 feeds current to the substrate electrode 320 of the frame body 240b corresponding to the back surface of the substrate W.

As described above, current is fed to the substrate electrode 320. Accordingly, it is necessary to configure the substrate holder 1 such that the plating solution does not contact the substrate electrode 320 even when the substrate holder 1 is immersed in the plating solution. Therefore, the substrate holder 1 includes an outer seal 300 and inner seals 310 for sealing a space where the substrate electrodes 320 are present. The inner seal 310 may be referred to as a "first seal member" and the outer seal 300 may be referred to as a "second seal member." The outer seal 300 is configured to seal a gap between the frame body 240a and the frame body 240b on an outer side of the substrate W. The outer seal 300 may be provided on the frame body 240a or may be provided on the frame body 240b. In other words, the substrate holder 1 may include the outer seal 300 that is configured to be attached to one of the front frame 200a and the rear frame 200b and contact the other of the front frame 200a and the rear frame 200b. Meanwhile, the inner seal 310 is provided on both the frame body 240a and the frame body 240b. The inner seals 310 contact the substrate W when the substrate W is held. That is, the inner seal 310 provided on the frame body 240a is configured to seal a gap between the frame body 240a and the substrate W. The inner seal 310 provided on the frame body 240b is configured to seal a gap between the frame body 240b and the substrate W. The outer seal 300 and the inner seals 310 can be elastically deformed in a direction of the thickness of the substrate W (direction perpendicular to the surface of the substrate W). The substrate W is held between the frame body 240a and the frame body 240b by contact pressure between the inner seals 310 and the substrate W. Note that FIG. 3 is a mere schematic view and can be different from an actual configuration. For example, the outer seal 300 and the inner seals 310 may be held by respective seal holders. For example, the inner seal 310 may be provided on one of the front frame 200a and the rear frame 200b.

Figure 4:
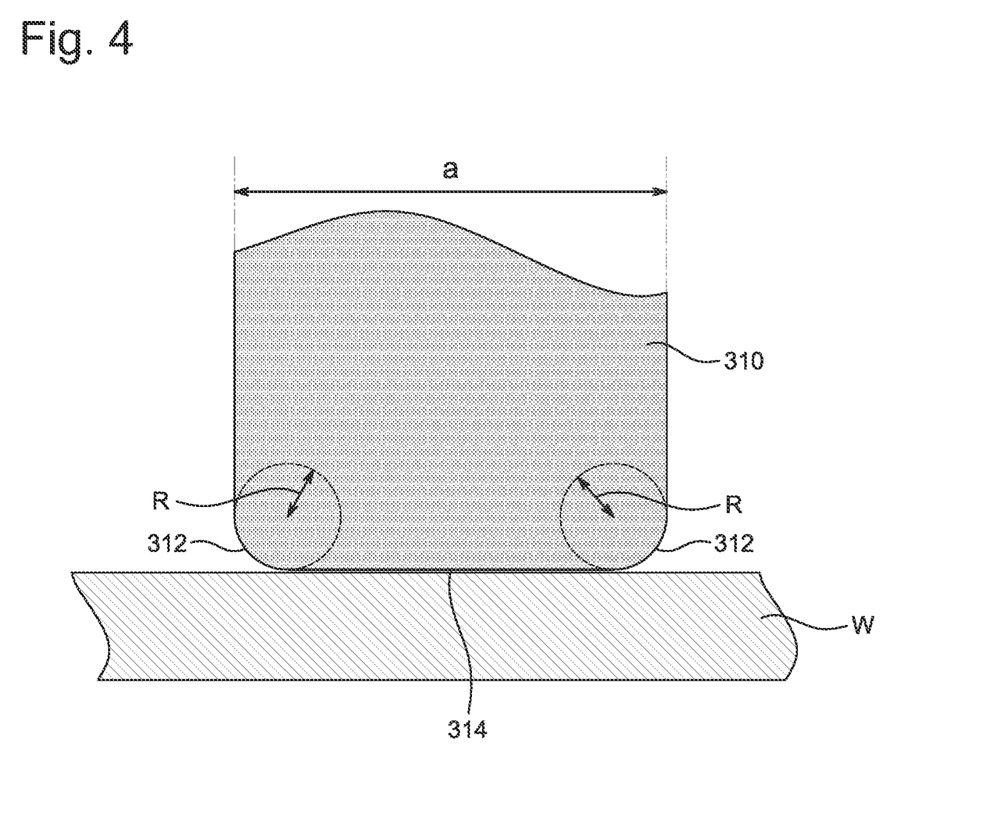
FIG. 4 is an enlarged cross-sectional view illustrating a contact portion between an inner seal and a substrate or a frame according to an embodiment.

FIG. 4 is an enlarged cross-sectional view illustrating a contact portion between the inner seal 310 and the substrate W according to an embodiment. Note that, as described above, in a state where the substrate W is held by the substrate holder 1, the inner seal 310 is compressed and pressed against the substrate W. FIG. 4 illustrates a shape of the inner seal 310 in an uncompressed, natural state. Moreover, in FIG. 4, "a" indicates the width of the seal in a natural state. Regarding the inner seal 310 illustrated in FIG. 4, in cross-section viewed in a plane (surface illustrated in FIG. 4) perpendicular to the longitudinal direction (direction perpendicular to the plane of the paper), the contact portion of the inner seal 310 includes arc portions 312 having an arc shape. Moreover, it can be said that the cross-section of the inner seal 310 illustrated in FIG. 4 is cross-section viewed in a plane passing the center of the substrate and perpendicular to the surface of the substrate. The inner seal 310 illustrated in FIG. 4 includes two arc portions 312. Regarding the inner seal 310 illustrated in FIG. 4, the two arc portions 312 are arranged at both ends of the contact surface between the inner seal 310 and the substrate W. Regarding the inner seal 310 illustrated in FIG. 4, a plane 314 parallel to the substrate W is provided between the two arc portions 312. In FIG. 4, one of the right and left sides of the inner seal 310 is a side where the substrate electrode 320 is arranged, and is an outer circumferential side of the substrate W. The other of the right and left sides of the inner seal 310 is a central side of the substrate W, and is a side that contacts the plating solution. The inner seal 310 includes the two arc portions 312 in the direction from the central side of the substrate W to the outer circumference side. It can be said that the inner seal 310 includes the two arc portions 312 in the direction from a side near from the substrate electrode 320 to a side far from the substrate electrode 320.

Figure 5:
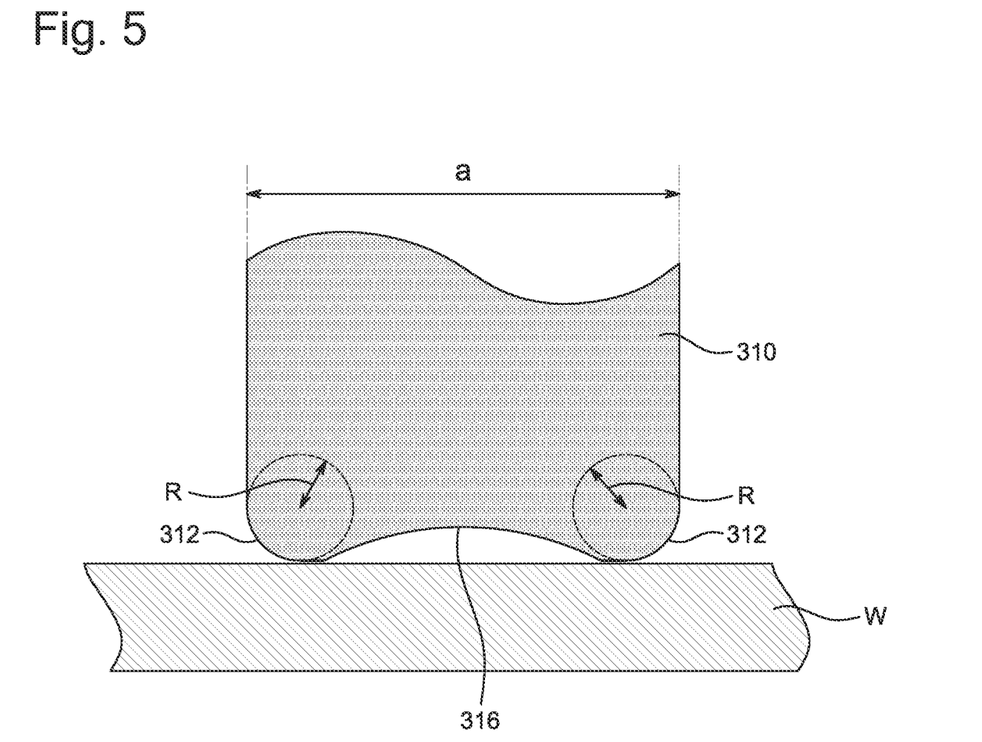
FIG. 5 is an enlarged cross-sectional view illustrating a contact portion between an inner seal and a substrate or a frame according to an embodiment.

FIG. 5 is an enlarged cross-sectional view illustrating a contact portion between the inner seal 310 and the substrate W according to an embodiment. Similar to FIG. 4, FIG. 5 illustrates a shape of the inner seal 310 in an uncompressed, natural state. Moreover, in FIG. 5, "a" indicates the width of the seal in a natural state. Similar to the inner seal 310 illustrated in FIG. 4, the inner seal 310 illustrated in FIG. 5 includes two arc portions 312. The inner seal 310 illustrated in FIG. 5 includes a recess 316 between the two arc portions 312. The recess 316 has an effect of increasing an edge effect at both seal end portions, which will be described later, and providing a relatively increased sealing pressure as compared with the plane 314 illustrated in FIG. 4.

The arc portion 312 of the inner seal 310 according to the aforementioned embodiment desirably has a smaller curvature radius R. This is because the edge effect, concentration of the pressure of the seal on both seal end portions that vary in seal shape, i.e., on protruding portions formed by the arc portions having a small curvature radius R, increases. As an example, the arc portion 312 may have a curvature radius R of about 0.01 mm to 0.1 mm. In an example, the inner seal 310 may be manufactured by molding from a polymeric material, e.g., rubber material or resin material. Note that, as described above, the arc portion 312 desirably has a smaller curvature radius R. Therefore, one conceivable way would be to form the end of the contact portion of the inner seal 310 into a cornered shape, not an arc shape. However, when the seal is molded, burr, void or the like is likely to occur at a corner portion. Because the contact surface of the seal needs to be a smooth continuous surface without burr, void and the like, it is desirable that the end of the contact portion of the seal have an arc shape having a small curvature radius as described above, not a corner portion.

In the embodiments illustrated in FIGS. 4 and 5, the inner seal 310 includes the two arc portions 312 in a cross-sectional shape. However, the inner seal 310 may include a more number of arc portions 312 in a different embodiment. Moreover, the arc portions 312 may all have the same curvature radius R or may have different curvature radii.

Figure 6:
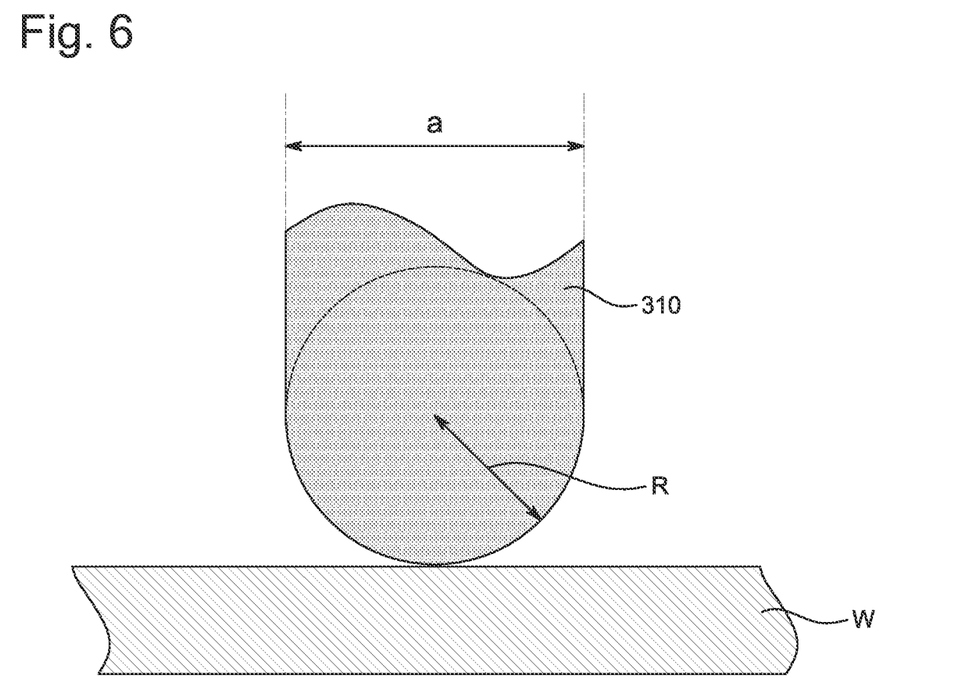
FIG. 6 is an enlarged cross-sectional view illustrating a contact portion between an inner seal and a substrate or a frame according to an embodiment.

FIG. 6 is an enlarged cross-sectional view illustrating a contact portion between the inner seal 310 and the substrate W according to a reference example. Similar to FIGS. 4 and 5, FIG. 6 illustrates a shape of the inner seal 310 in an uncompressed, natural state. Moreover, "a" indicates the width of the seal in a natural state. Note that, in FIGS. 4, 5 and 6, the widths "a" of the seals are the same. The inner seal 310 of the reference example illustrated in FIG. 6 has an arc shape having one contact portion.

Figure 7:
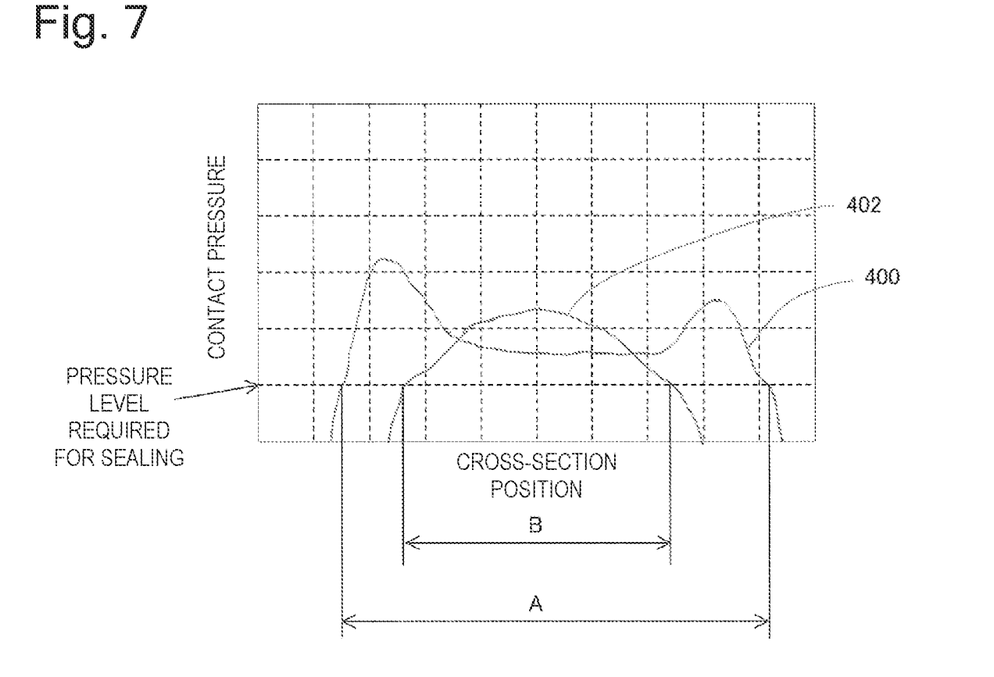
FIG. 7 is a graph illustrating contact pressure with respect to a cross-sectional position of a seal.

FIG. 7 is a graph illustrating contact pressure relative to cross-section position in a case where the inner seal 310 illustrated in FIG. 4 and the inner seal 310 illustrated in FIG. 6 are pressed against the substrate W. In the graph illustrated in FIG. 7, a curve 400 indicates pressure applied to the substrate W when the inner seal 310 having the width a illustrated in FIG. 4 is pressed against the substrate W. In the graph illustrated in FIG. 7, a curve 402 indicates pressure applied to the substrate W when the inner seal 310 having the width a illustrated in FIG. 6 is pressed against the substrate W. In the graph illustrated in FIG. 7, the widths a of the inner seals 310 corresponding to the curves 400 and 402 are the same. As indicated by the curve 400 of FIG. 7, in the case of the inner seal 310 including the two arc portions 312 illustrated in FIG. 4, the contact pressure increases at the arc portions 312 positioned at both ends of the contact portion. This is because of the edge effect at the seal end portions described above. Meanwhile, as indicated by the curve 402 of FIG. 7, in the case of the inner seal 310 of the reference example illustrated in FIG. 6, the contact pressure increases at the middle portion. Moreover, the range of the contact pressure or more required for sealing (ranges indicated at "A" and "B" in FIG. 7) is also wider in the case of the curve 400 than in the case of the curve 402 under the condition that the widths a of the seals are the same. As illustrated in FIG. 7, when the arc portion 312 is formed at both ends of the inner seal 310, the contact pressure increases at the arc portions 312 and the range of the required contact pressure or more also becomes wider. Therefore, the sealing performance increases as compared with the case of the inner seal 310 including one arc portion illustrated in FIG. 6. Furthermore, because the peak of the contact pressure is formed on two points, even if the plating solution enters over the sealing portion at which one of the peaks occurs, it is possible to prevent further entry of the plating solution at the sealing portion at which the other of the peaks occurs.

Figure 8:
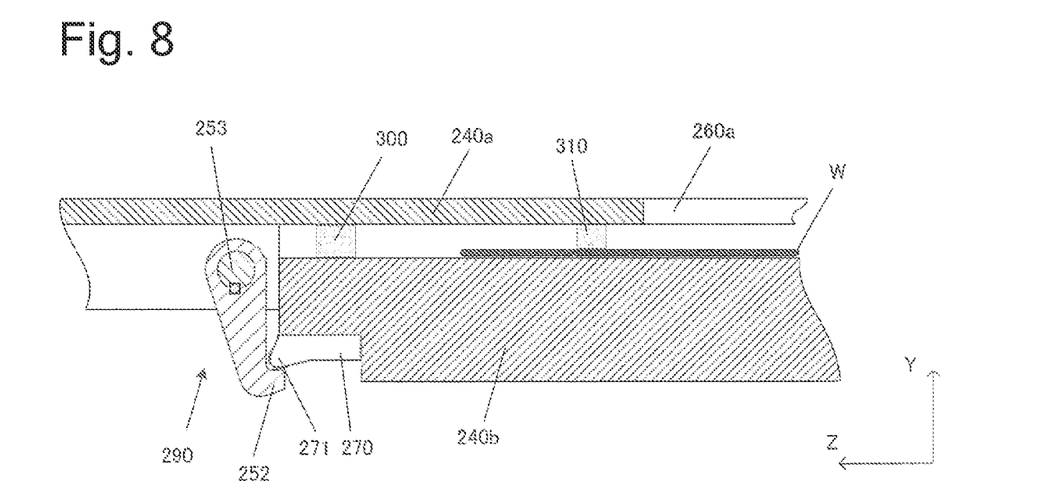
FIG. 8 is a cross-sectional side view schematically illustrating a substrate holder according to an embodiment.

Note that although a description is given of the cross-section of the inner seal 310 in FIGS. 4 and 5, the shape of the seal including the plurality of arc portions 312 may be applied not only to the inner seal 310, but also to the outer seal 300 or other seals. Moreover, the substrate holder to which the seal of the present disclosure is applied may be a substrate holder for two-side plating illustrated in FIGS. 2 and 3, may be a substrate holder for one-side plating illustrated in FIG. 8, may be a substrate holder for holding a substrate having a circular shape, or may be a substrate holder for holding a substrate having a quadrilateral shape. Note that FIG. 8 is a cross-sectional side view schematically illustrating a substrate holder for one-side plating according to an embodiment. In FIG. 8, elements similar to those of the substrate holder illustrated in FIG. 2 are designated by the same reference numerals, and therefore the substrate holder of FIG. 8 will not be described in detail.

According to the aforementioned embodiments, at least the technical idea described below can be understood.

[Form 1] According to Form 1, there is provided a substrate holder including: a first holding member; a second holding member; a damper configured to clamp the first holding member and the second holding member; and a seal including a contact portion configured to contact at least one of the first holding member, the second holding member, and a substrate when the first holding member and the second holding member are clamped, in which the contact portion includes, in cross-section viewed in a plane passing a center of the substrate and perpendicular to a surface of the substrate, a first arc portion centered on a first point and a second arc portion centered on a second point different from the first point, and at least one of the first arc portion and the second arc portion has a curvature radius of 0.01 mm to 0.1 mm.

[Form 2] According to Form 2, the substrate holder according to Form 1, in which the first arc portion and the second arc portion are arranged at respective ends of the contact portion.

[Form 3] According to Form 3, the substrate holder according to Form 2, including a plane between the first arc portion and the second arc portion.

[Form 4] According to Form 4, the substrate holder according to Form 2, including a recess surface between the first arc portion and the second arc portion.

[Form 5] According to Form 5, the substrate holder according to any one of Forms 1 to 4, in which the substrate holder is configured to hold a polygonal substrate.

REFERENCE SIGN LIST 1 substrate holder
200a front frame (holding member)
200b rear frame (holding member)
210a, b arm portion
220 shoulder electrode
230a, b wire storage portion
240a, b frame body
241a, b port
250 hook portion
251 hook base
252 hook body
253 shaft
254 lever
255 press member
260a opening
260b opening
270 plate
271 claw
280 elastic support member
290 damper
300 outer seal (second seal member)
310 inner seal (first seal member)
312 arc portion
320 substrate electrode
W substrate

What is claimed is:

1. A substrate holder comprising:
a first holding member;
a second holding member;
a clamper configured to clamp the first holding member and the second holding member;
and
a seal including a contact portion configured to contact at least one of the first holding member, the second holding member, and a substrate when the first holding member and the second holding member are clamped, wherein
the contact portion includes, in cross-section viewed in a plane passing a center of the substrate and perpendicular to a surface of the substrate, and in an uncompressed state, a first arc portion centered on a first point and a second arc portion centered on a second point different from the first point, and at least one of the first arc portion and the second arc portion has a curvature radius of 0.01 mm to 0.1 mm,
wherein the seal includes, in cross-section viewed in the plane passing the center of the substrate and perpendicular to the surface of the substrate: a first straight portion perpendicular to the surface of the substrate and connected to the first arc portion; a second straight portion perpendicular to the surface of the substrate and connected to the second arc portion; and a third straight portion in parallel and contactable to the surface of the substrate and connected to the first and second arc portions.

2. The substrate holder according to claim 1, wherein the first arc portion and the second arc portion are arranged at respective ends of the contact portion.

3. The substrate holder according to claim 1, wherein the substrate holder is configured to hold a polygonal substrate.

* * * * *